United States Patent [19]

Heeren

[11] 4,288,910
[45] Sep. 15, 1981

[54] METHOD OF MANUFACTURING A SEMICONDUCTOR DEVICE

[75] Inventor: Richard H. Heeren, Palatine, Ill.

[73] Assignee: Teletype Corporation, Skokie, Ill.

[21] Appl. No.: 30,255

[22] Filed: Apr. 16, 1979

[51] Int. Cl.³ .......................................... H01L 21/22
[52] U.S. Cl. ...................................... 29/571; 148/187
[58] Field of Search ........................... 29/571; 148/187

[56] References Cited

U.S. PATENT DOCUMENTS

| 4,101,344 | 7/1978 | Kooi et al. | 148/187 X |
| 4,192,059 | 3/1980 | Khan et al. | 29/571 |
| 4,231,051 | 10/1980 | Custode et al. | 29/571 X |

Primary Examiner—G. Ozaki
Attorney, Agent, or Firm—W. K. Serp; J. C. Albrecht

[57] ABSTRACT

A method of manufacturing devices in a semiconductor body 20 of a first conductivity type. An oxygen impervious masking medium 22 is placed on the body 20. Portions of the medium 22 are removed to define field areas 31 and field oxide is formed in the field areas. The surface of the silicon wafer 23 is thereafter masked to define gate areas 26 and electrical contact areas 30. The exposed medium is removed and the exposed body areas doped to form interconnect runs 28 and a source/drain region 29 of a second conductivity type. An oxide 48, 50 is formed over the doped interconnect runs and source/drain regions of the wafer. The masking medium covering the contact area 30 is removed and the contact area is doped to a second conductivity type. Finally conductors 60, 61 are positioned to provide the desired electrical connections. In a first alternate embodiment the masking medium is a sandwich of different material layers 70, 72 and in a second alternate embodiment the masking medium is a sandwich of three different layers 80, 82 and 84.

9 Claims, 19 Drawing Figures

METHOD OF MANUFACTURING A SEMICONDUCTOR DEVICE

DESCRIPTION

1. Technical Field

This invention relates to a method of manufacturing insulated gate field-effect transistors (IGFETs) and circuits containing IGFETs having self-aligned electrical contacts as well as gates.

2. Background Art

Integrated circuits which utilize IGFETs are generally evaluated on the basis of frequency response and the degree of economical utilization of semiconductor surface area.

Both frequency performance and surface area requirements are dependent on the method of manufacture of the circuitry in the semiconductor. The manufacturing methods in current use generally involve successive masking steps some of which must be physically aligned. The alignment of successive masks is somewhat difficult to control and a certain amount of additional semiconductor surface area must be provided in recognition of attainable tolerances in mask alignment. Considerable cost and area savings may be obtained by those methods which reduce or eliminate critical mask alignments i.e., include self-alignment features in the formation of source/drain, interconnect, gate, contact and conductor regions of the IGFET devices. Additionally, self-alignment features improve frequency response by reducing the size of parasitic capacitances in the IGFET device.

DISCLOSURE OF THE INVENTION

The method disclosed utilizes a doped silicon, i.e., semiconductor body of a first conductivity type having formed thereon a masking medium. Selected portions of the masking medium are removed to expose the surface of the semiconductor body whereat a field insulator is formed. The disclosed method is characterized by the following steps:

1. Remove selected portions of the remaining masking medium to define interconnect and source/drain regions on the surface of the wafer;
2. Dope the source/drain regions and interconnect runs to a second conductivity type;
3. Form an insulator over the doped source/drain regions and interconnect runs;
4. Remove additional portions of the masking medium thereby defining electrical contact areas;
5. Dope the contact areas to form areas of a second conductivity type;
6. Prepare the gate areas defined by the remaining masking medium and the contact areas for a reception of electrical conductors; and
7. Place electrical conductors at selected locations on the wafer surface to provide electrical contact with the gate and contact areas.

In a first alternate embodiment, the masking medium is a sandwiched layer of materials including a layer of a dielectric material in the form of silicon dioxide placed adjacent the surface of the wafer and an outer layer of oxygen impervious material such as silicon nitride. In a second alternate embodiment, the masking medium is a three-layer sandwich of materials including a layer of gate dielectric in the form of silicon dioxide placed adjacent the surface of the wafer, a conductive layer such as polysilicon over the silicon dioxide layer and finally an outer oxygen impervious layer of silicon nitride.

In the resulting IGFET structures, there is a self-alignment between the gate area and the doped source/drain regions as well as between the doped electrical contact areas and interconnect runs. In the second alternate embodiment there is also self-alignment between the gate electrode and the gate dielectric.

THE DRAWINGS

FIGS. 1 through 13, inclusive, illustrate selected steps during the manufacture of an insulated gate field-effect transistor (IGFET) in accordance with a preferred embodiment of this invention;

FIGS. 14 through 16 illustrate selected alternate steps to the method illustrated in FIGS. 1 to 13 during the manufacture of an insulated gate field-effect transistor (IGFET) in accordance with a first alternate embodiment of this invention; and FIGS. 17 through 19 illustrate selected alternate steps to the method illustrated in FIGS. 1 to 13 during the manufacture of an insulated gate field effect transistor (IGFET) in accordance with a second alternate embodiment of this invention.

DETAILED DESCRIPTION

Preferred Embodiment

Figure 1:
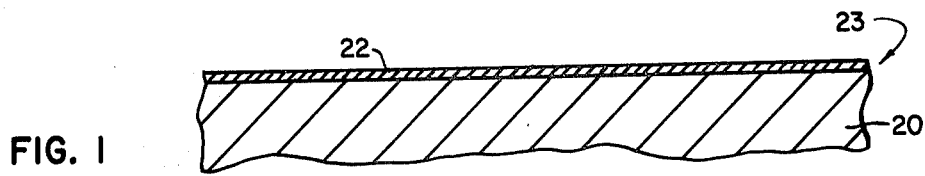
Figure 2:
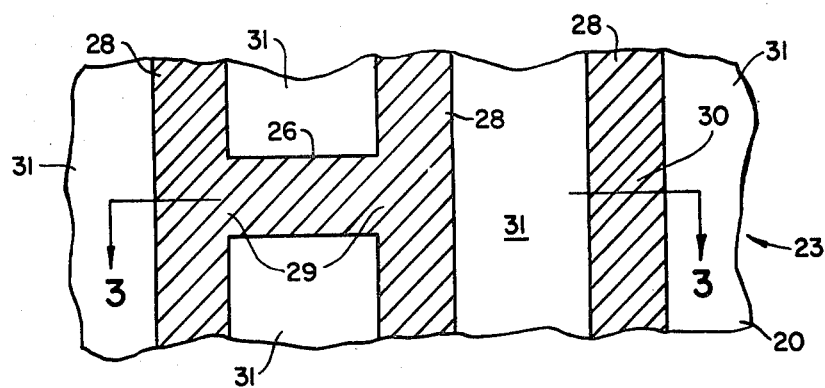
Figure 3:
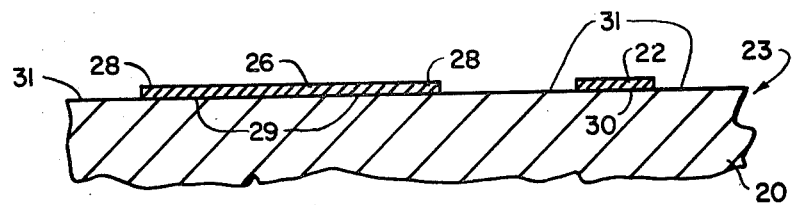
Figure 4:
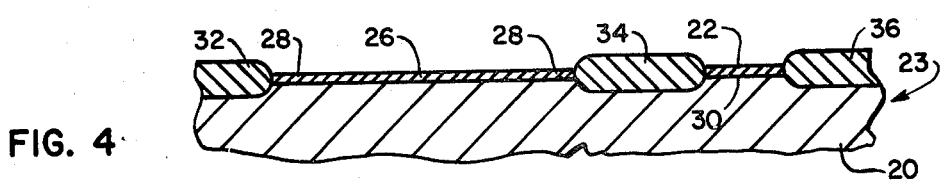

The method illustrated in FIGS. 1 to 13 will be described utilizing a P-type silicon body 20 with N-type doped interconnect runs and source/drain regions, that is, N-channel technology. The process steps disclosed are also applicable to P-type doping in combination with an N-type silicon body, i.e., P-channel technology. As shown in FIG. 1, the surface of the semiconductor body 20 forming a portion of the wafer 23 is covered with a layer of masking medium such as silicon nitride or a sandwich of several materials as will be subsequently considered in connection with the two alternate embodiments of FIGS. 14 through 19. As will be more fully appreciated, the masking medium 22 should allow selective formation of field regions and doped region insulator materials. Further it should serve to allow selective impurity doping of the body 20 in only those areas where it has been removed and preferably should be able to be selectively removed without substantially effecting surrounding materials. These characteristics are also common to the outer layer of the masking medium utilized in the following two alternate embodiments. A photoshaping operation using a first mask serves to pattern the masking medium 22 as shown in FIG. 2. The first mask defines a gate area 26, interconnect runs 28, source/drain regions 29 and contact areas 30. Alternately, the first mask can be said to define field regions 31. During photoshaping, selected portions of the masking medium 22 are removed from the field regions 31 of the P-type silicon body 20 as shown in FIG. 3, by means well known and practiced in the art. The entire wafer 23 is then exposed to an oxygen atmosphere under elevated temperature conditions which causes field oxide growth 32, 34 and 36 in the field regions 31 as shown in (FIG. 4). The oxygen impervious property of the remaining masking medium 22 prevents oxide growth in areas and regions other than the field areas 31 such as at 26, 28, 29 and 30.

As is well known, the field regions 31 may be doped before, during or after the growth of the field oxide 32, 34, and 36 to modify the concentration of impurities in the surface of the silicon wafer 20 to control detrimental parasitic leakage current. Also, prior to the growth of the field oxide 32, 34 and 36, selected portions of the exposed body surface could be removed from the field areas 31 to reduce the resulting height discontinuities between the surface of field oxide areas 32, 34, 36 and the surface of non-field areas 26, 28, 29 and 30.

Figure 5:
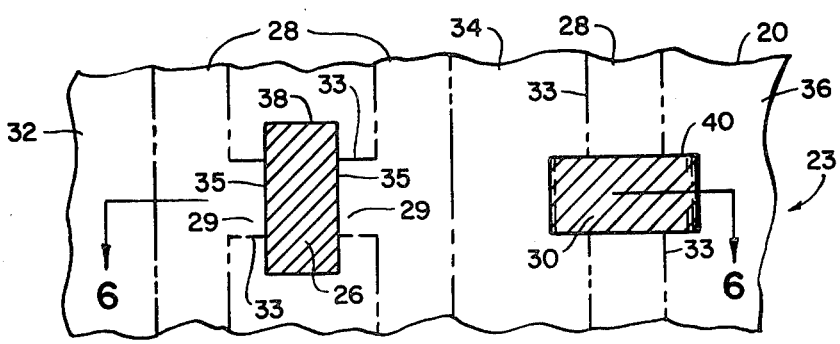
Figure 6:
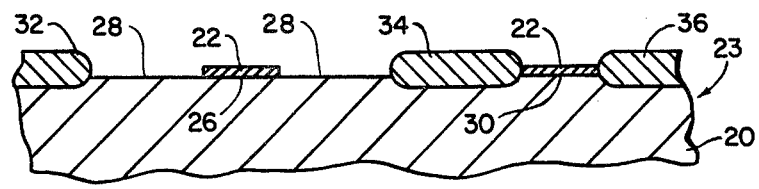

A second photoshaping operation is performed using a second mask to produce the gate pattern 38 and a contact pattern 40 of FIG. 5. The pattern of the first photoshaping operation is shown in phantom in FIG. 5 to provide the reader with a better appreciation of the freedom of alignment allowed between the two photoshaping masks. The second mask, in conjunction with the first mask, fully defines the gate area 26 and the electrical contact area 30. Alternately, the second mask, in conjunction with the first mask, can be said to define the source/drain regions 29 and interconnect runs 28. During the second photoshaping operation, portions corresponding to the interconnect runs 28 and the source/drain regions 29 of the remaining masking medium are removed. The masking medium is not removed in the gate area 26 or the electrical contact area 30 as shown in FIG. 6.

The gate area 26 is self-aligned to the source/drain areas 29 since only the edges 35 of the second mask define the adjacent boundaries of both the gate and source/drain regions. Similarly, the electrical contact area 30 is self-aligned to the corresponding doped interconnect run 28 since only the second mask defines both the adjacent boundaries of the contact area 30 and corresponding interconnect run 28. Also, the gate areas 26 are self-aligned to the field areas since only the first mask edges 33 define the adjacent boundaries. Likewise, the electrical contact areas 30 are self-aligned to the field areas and hence in register with the interconnect runs 28 since only the first mask edges 33 define the boundaries between field and contact area 30 as well as between the field areas and interconnect runs 28.

Figure 7:
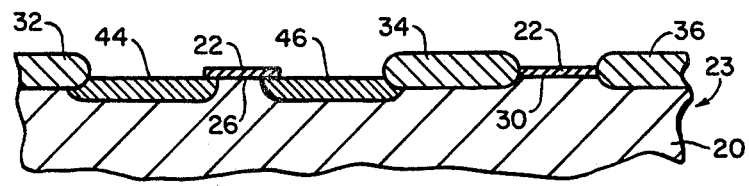
Figure 8:
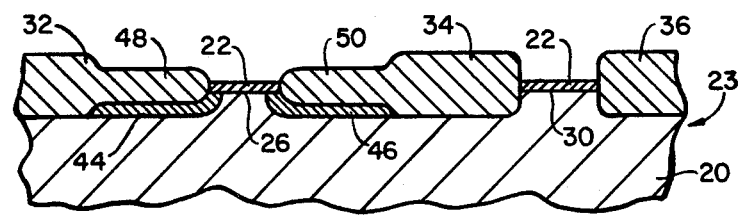

Upon completion of the photoshaping step, the exposed interconnect runs 28 and source/drain regions 29 of the P-type wafer 20 are doped by means well known in the art to create doped regions 44 and 46 of opposite conductivity type, i.e. N-type as shown in FIG. 7. As illustrated in FIG. 8, an insulator or dielectric, such as thermal oxide, 48 and 50 is formed over the doped regions 44 and 46 forcing the N-type material deeper into the P-type wafer body and further increasing the thickness of the previously grown field oxide 32, 34.

Figure 9:
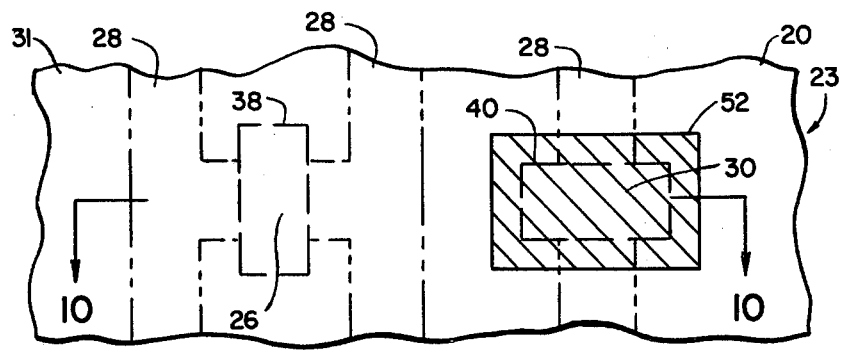
Figure 10:
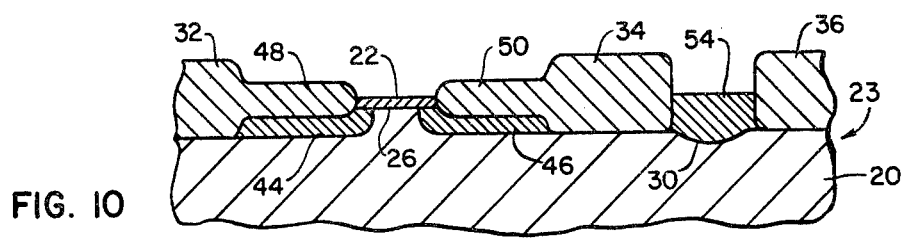
Figure 11:
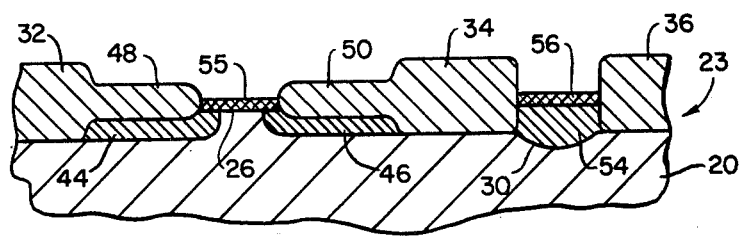

A third photoshaping operation utilizes a third mask, as illustrated by the crosshatched pattern 52 in FIG. 9, to define, in conjunction with the first and second masks, the electrical contact area 30. The positioning of this third mask is relatively non-critical since the size and position of the contact area 30 has previously been determined by the first and second masks (FIG. 5). The pattern 52 is somewhat larger than the contact areas 30 which greatly facilitates positioning. During photoshaping, further selected portions within the rectangular pattern 52 of the masking layer 22 are removed. The masking medium 22 over the gate areas 26 is protected by the photoshaping mask and thus is not removed as shown in FIG. 10.

Upon completion of this third photoshaping step, the exposed contact area 30 of the body 20 is doped to form doped contacts 54 of opposite conductivity type to the body 20. The doped contact 54 is self-aligned since none of the edges defining doped region 54 are determined by more than one mask and therefore is in perfect alignment with the edges of the previously doped interconnect runs 28. Preferably, the doped contact region 54 is made somewhat deeper than the source/drain and interconnect regions 44 and 46. This increased doping depth of the region 54 is preferable since it prevents puncture of the region when a metallic conductor is subsequently applied.

Figure 12:
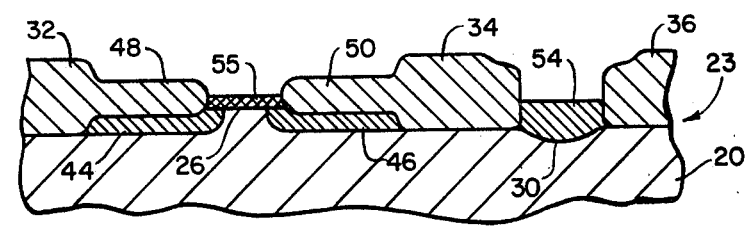
Figure 13:
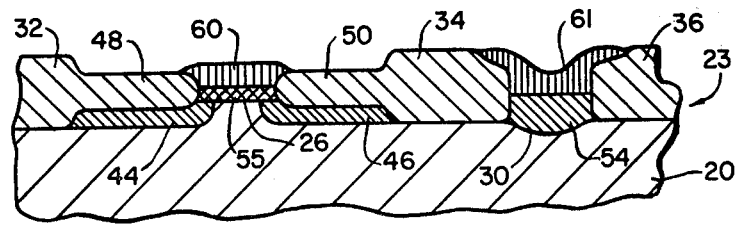

In the preferred embodiment, the wafer 23 is exposed to an operation which removes remaining portions of the masking layer at the gate area 26. After removal of the remaining masking layer 22, a thin layer of gate dielectric is formed over the exposed gate areas 26 and contact areas 30, such as a thermal oxide, illustrated in FIG. 11 as a thin oxide region 55 and 56. The thin gate oxide 56 grown over the contact area 26 is then removed by a photoshaping operation. This photoshaping operation may use the same mask as produced the pattern 52 of FIG. 9. Since the field oxide 34 and 36, surrounding the contact area, is relatively thick, this etching process does not materially effect its depth. The cross section of the body 20 after this operation is illustrated in FIG. 12. The gate area 26 may be doped before, during or after the formation of the gate dielectric in order to adjust certain electrical parameters of the resulting IGFET device such as its threshold voltage. This doping may be restricted to selected gate areas on a single wafer thus creating multiple IGFET types in the same wafer. The surface of the wafer 23 is next covered with a conductive layer such as aluminum or polysilicon. Thereafter, a fourth mask (not shown) is used in a photoshaping operation to delineate the desired pattern of electrical interconnections and gate electrodes illustrated in FIG. 13 as regions 60 and 61.

First Alternate Embodiment

Figure 14:
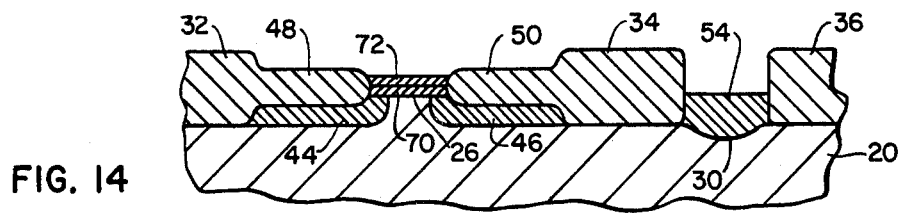
Figure 15:
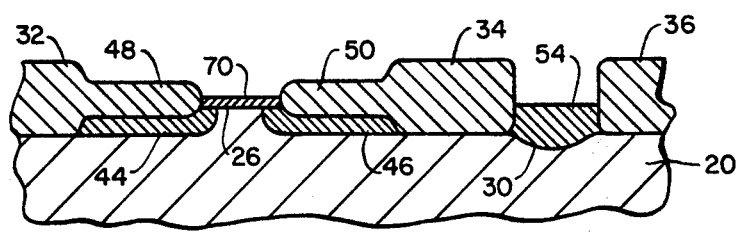
Figure 16:
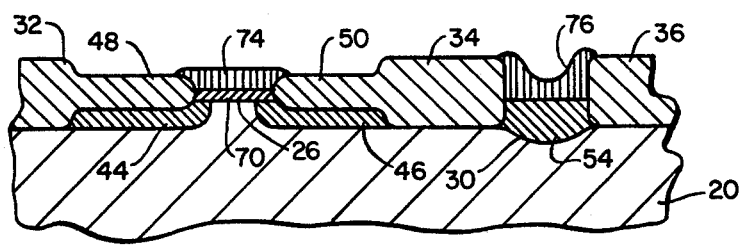
Figure 17:
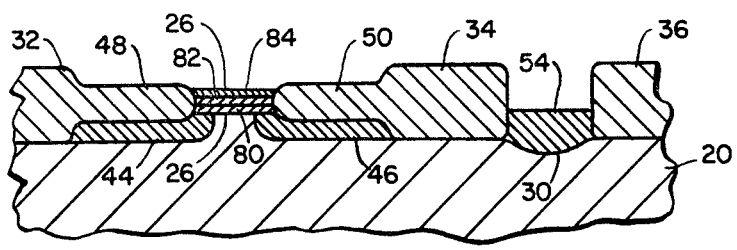

FIGS. 1 through 9 illustrate steps which are common to the preferred as well as the first alternate embodiment with FIG. 14 corresponding to FIG. 10 of the Preferred Embodiment and with the alternate gate preparation steps unique to the first alternate embodiment being illustrated in FIGS. 15 and 16. The masking medium, rather than being a single layer of material, is a sandwich of two layers 70 and 72. The first layer 70, which is adjacent the P-type silicon body 20, is a thin dielectric gate material such as thermal oxide and the outer layer 72 is a thin layer of material such as silicon nitride. During each of the preceeding steps illustrated in FIGS. 1 through 10, the removal of the masking medium requires that at least the outer layer 72 is removed.

After formation of the doped region 54 at the contact area 30, the outer layer 72 is removed from the gate area 26, (FIG. 15) leaving the gate dielectric layer 70 exposed. Thereafter, the surface of the wafer 23 is covered with a conductive layer such as aluminum or polysilicon. The conductive layer is photoshaped to obtain the desired patterns of conductors 74 and 76 shown in FIG. 16. It should be noted that this alternate embodiment eliminates one photoshaping operation as compared to the preferred method previously described. That is, this embodiment does not require the application and removal of the thin oxide coating 56 of the first embodiment (FIG. 11) over the contact area 30. However, the alternate embodiment uses a more complicated dual layer masking medium.

Second Alternate Embodiment

Figure 18:
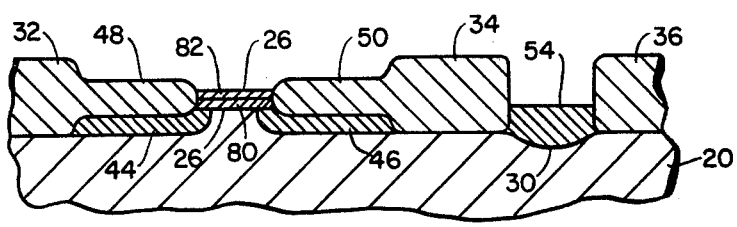
Figure 19:
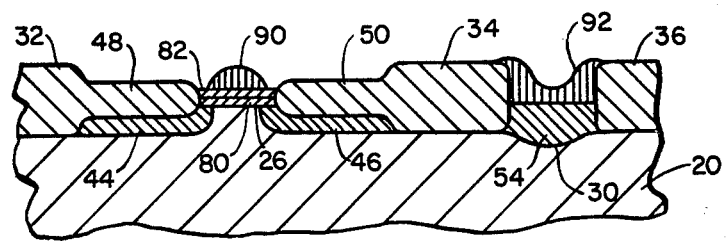

FIGS. 1 through 9 illustrate steps which are common to the preferred as well as the second alternate embodiment. The step illustrated in FIG. 17 corresponds to the step illustrated in FIG. 10 of the preferred embodiment and the alternate gate preparation steps unique to the second alternate embodiment are illustrated in FIGS. 18 and 19. In this second embodiment the masking medium 22 of the Preferred Embodiment, rather than being a single layer, is a sandwich of three layers of material. The first layer 80, adjacent to the P-type body 20, is a thin layer of gate dielectric material such as thermal oxide. The next layer 82 is a thin layer of conductive material such as doped polysilicon and the top layer 84 is silicon nitride. After formation of the doped regions 54 at the contact area 30, the outer layer 84 over the gate area 26 is removed as shown in FIG. 18 and the wafer 23 is covered with a conductive material which is photoshaped defining conductors 90 and 92 as shown in FIG. 19. As a result of the preceding operations, the body 20 at the gate area 26 is covered with a self-aligned layer of gate dielectric 80 over which is a self-aligned conductive gate electrode layer 82 (FIG. 18). Since the gate dielectric 80 at the gate area 26 is completely covered by the conductive gate electrode 82, the conductor 90 is only required to make contact with a portion of the gate electrode layer 82 and is not required to completely cover the entire gate area 26 as in the preceeding embodiments. Thus, the alignment tolerances of the mask, which delineate the conductors 90 and 92 is much less restrictive than in the previous embodiments. Further, parasitic capacitance is reduced since the size of the metallic conductor overlaying the gate area 26 need be only of sufficient size to provide the necessary contact.

The three disclosed methods produce IGFET devices and electrical contacts exhibiting minimum physical dimensions without the necessity of observing extreme photomask registration tolerances. Further, parasitic capacitances have been greatly reduced resulting in a relatively high upper frequency limit. Although this invention has been particularly shown and described with reference to three embodiments thereof, it should be understood that various changes in form and detail may be made without departing from the scope and spirit of the invention.

What is claimed is:

1. A method of manufacturing devices on a semiconductor wafer 23 of a first conductivity type having formed on the body 20 of the wafer 23 a masking medium 22, removing selected portions of the masking medium 22 to expose the surface of the body 20 thereby defining field regions 31 on the surface of the wafer and forming a field insulator 32, 34, 36, at the exposed locations on the surface of the body 20, wherein the improvement comprises the steps of:

A. Removing selected portions of the remaining masking medium 22 so as to define source/drain regions 29 and interconnect runs 28 on the surface of the wafer 23,
B. Doping the source/drain regions 29 and interconnect runs 28 to a second conductivity type 44, 46,
C. Forming an insulator 48, 50 over the doped source/drain regions 29 and interconnect runs 28,
D. Removing the masking medium 22 covering an electrical contact area 30,
E. Doping the electrical contact area 30 to a second conductivity type 54,
F. Preparing the gate and contact area 26, 30 for reception of electrical conductors 60, 61, and
G. Placing electrical conductors 60, 61 at selected locations on the wafer 23 surface to provide electrical contact with the gate and contact area 26, 30.

2. The method of claim 1 wherein step (F) includes removing the masking medium 22 from the gate area 26 of the wafer 23, and covering the gate area 26 with a thin layer of gate dielectric 55.

3. The method of claim 2 wherein the doped second conductivity type material 54 at the contact area 30 is formed deeper within the body 20 of the wafer 23 than the doped source/drain regions 29.

4. The method of claim 1 wherein step (F) further includes removing the masking medium 22 from the gate area 26 of the wafer 23, and covering the entire surface of the wafer 23 with a gate dielectric and thereafter removing the gate dielectric from the contact area 30 prior to the formation of the electrical conductors 60, 61 on the surface of the wafer 23.

5. The method of claim 4 wherein the doped second conductivity type material 54 at the area 30 is formed deeper within the body 20 of the wafer 23 than the doped source/drain regions 29.

6. The method of claim 1 wherein said masking medium 22 over the surface of the wafer 23 comprises a sandwich including a layer of gate dielectric 70 placed adjacent the surface of the body 20 and an outer oxygen impervious layer 72 and step F includes removing the oxygen impervious layer 72 covering the gate area 26.

7. The method of claim 6 wherein the doped second conductivity type material 54 at the contact area 30 is formed deeper into the body 20 of the wafer 23 than the doped 44, 46 source/drain regions 29.

8. The method of claim 1 wherein said masking medium comprises a sandwich including a layer of gate dielectric 80 placed adjacent the surface of the body 20, a conductive layer 82 over the gate dielectric layer 80 and finally an outer oxygen impervious layer 84; and
wherein step F includes removing the oxygen impervious layer 84 covering the gate area 26.

9. The method of claim 8 wherein the doped second conductivity type material 54 at the contact area 30 is formed deeper into the body 20 than the doped source/drain regions 29.

* * * * *